US008481164B2

(12) United States Patent
Cha et al.

(10) Patent No.: US 8,481,164 B2
(45) Date of Patent: *Jul. 9, 2013

(54) MATERIALS HAVING PREDEFINED MORPHOLOGIES AND METHODS OF FORMATION THEREOF

(75) Inventors: Jennifer Nam Cha, Union City, CA (US); James Lupton Hedrick, Pleasanton, CA (US); Ho-Cheol Kim, San Jose, CA (US); Robert Dennis Miller, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1139 days.

This patent is subject to a terminal disclaimer.

(21) Appl. No.: 12/061,283

(22) Filed: Apr. 2, 2008

(65) Prior Publication Data

US 2008/0213556 A1 Sep. 4, 2008

Related U.S. Application Data

(63) Continuation of application No. 11/950,453, filed on Dec. 5, 2007, which is a continuation of application No. 11/077,804, filed on Mar. 11, 2005, now Pat. No. 7,341,788.

(51) Int. Cl.
*C08L 53/00* (2006.01)
*B32B 5/22* (2006.01)
*B32B 27/28* (2006.01)

(52) U.S. Cl.
USPC ........... 428/446; 428/521; 428/522; 428/523; 525/88; 525/90; 525/92 R; 525/92 A; 977/701; 977/712

(58) Field of Classification Search
USPC ............. 428/96, 221, 304.4, 308.4, 446, 521, 428/522, 523; 525/88, 92 A, 90, 92 R; 977/701, 977/712
See application file for complete search history.

(56) References Cited

U.S. PATENT DOCUMENTS

| | | | |
|---|---|---|---|
| 3,847,644 A | | 11/1974 | Erhardt et al. |
| 4,096,204 A | * | 6/1978 | Gergen et al. .................. 525/96 |
| 6,093,636 A | | 7/2000 | Carter et al. |
| 6,107,357 A | | 8/2000 | Hawker et al. |
| 6,214,746 B1 | | 4/2001 | Leung et al. |
| 6,342,454 B1 | | 1/2002 | Hawker et al. |
| 6,670,285 B2 | | 12/2003 | Hawker et al. |
| 7,341,788 B2 | | 3/2008 | Cha et al. |
| 2002/0055239 A1 | | 5/2002 | Tuominen et al. |
| 2003/0091752 A1 | | 5/2003 | Nealey et al. |
| 2003/0207595 A1 | | 11/2003 | Ralamasu et al. |
| 2003/0222048 A1 | | 12/2003 | Asakawa et al. |
| 2004/0048960 A1 | | 3/2004 | Peterson et al. |
| 2004/0050816 A1 | | 3/2004 | Asakawa et al. |
| 2004/0096593 A1 | | 5/2004 | Lukas et al. |
| 2004/0096672 A1 | | 5/2004 | Lukas et al. |
| 2004/0161922 A1 | | 8/2004 | Gallagher et al. |
| 2005/0003016 A1 | * | 1/2005 | Discher et al. ................. 424/490 |
| 2006/0205875 A1 | * | 9/2006 | Cha et al. ........................ 525/88 |
| 2006/0211816 A1 | * | 9/2006 | Ho et al. ........................ 525/55 |

OTHER PUBLICATIONS

Huo et al.; Mesostructure Design with Gemini Surfactants: Supercage Formation in a Three-Dimensional Hexagonal Array; Science, vol. 268; Jun. 2, 1995; pp. 1324-1327.
Bates, Frank S.; Polymer-Polymer Phase Behavior; Science, vol. 251; Feb. 22, 1991; pp. 898-905.
Zhao et al.; Triblock Copolymer Syntheses of Mesoporous Silica with Periodic 50 to 300 Angstrom Pores; Science, vol. 279; Jan. 23, 1998; pp. 548-552; www.sciencemag.org.
Templin et al.; Organically Modified Aluminosilicate Mesostructures from Block Copolymer Phases; Science, vol. 278; Dec. 5, 1997; pp. 1795-1798; www.sciencemag.org.
Bagshaw et al.; Templating of Mesoporous Molecular Sieves by Nonionic Polyethylene Oxide Surfactants; Science, vol. 269; Sep. 1, 1995; pp. 1242-1244.
Kresge et al.; Ordered mesoporous molecular sieves synthesized by a liquid-crystal template mechanism; Nature, vol. 359; Oct. 22, 1992; pp. 710-712.
Office Action (Mail Date Aug. 2, 2010) for U.S. Appl. No. 11/950,453, filed Dec. 5, 2007.

* cited by examiner

*Primary Examiner* — Jeffrey Mullis
(74) *Attorney, Agent, or Firm* — Schmeiser, Olsen & Watts, LLP

(57) ABSTRACT

A material and an associated method of formation. A self-assembling block copolymer that includes a first block species and a second block species respectively characterized by a volume fraction of $F_1$ and $F_2$ with respect to the self-assembling block copolymer is provided. At least one crosslinkable polymer that is miscible with the second block species is provided. The self-assembling block copolymer and the at least one crosslinkable polymer are combined to form a mixture. The mixture having a volume fraction, $F_3$, of the crosslinkable polymer, a volume fraction, $F_{1,4}$, of the first block species, and a volume fraction, $F_{2,4}$, of the second block species is formed. A material having a predefined morphology where the sum of $F_{2,4}$ and $F_3$ were preselected is formed.

15 Claims, 8 Drawing Sheets

MATERIALS HAVING PREDEFINED MORPHOLOGIES AND METHODS OF FORMATION THEREOF

This application is a continuation application claiming priority to Ser. No. 11/950,453, filed Dec. 5, 2007, which is a continuation application claiming priority to Ser. No. 11/077,804, filed Mar. 11, 2005.

FIELD OF THE INVENTION

The present invention relates to the field of materials having structures therein that are nanoscopic, and the physical and chemical properties associated with the aforementioned materials.

BACKGROUND OF THE INVENTION

Materials having nanoscopic structures are very attractive due to their potential application in the fields of low dielectric materials, catalysis, membrane separation, molecular engineering, photonics, bio-substrates, and various other fields. Several methods have been proposed to synthesize materials having nanoscopic structures. Typically, the synthetic methodologies revolve around techniques using organic or inorganic polymeric molecules as templates, phase separation processes involving binary mixtures, and multi-step templating chemical reactions among others.

Materials having nanoscopic structures and the methods of synthesis thereof have drawbacks that make each less than desirable. Typically, the methods are unable to provide materials in large quantities, very complex in execution, and economically prohibitive for scale-up. The materials synthesized often are mechanically weak, non-uniform in structure, and are of little use in their intended field of application. Therefore, a need exists for materials and methods of formation thereof that overcome at least one of the aforementioned deficiencies.

SUMMARY OF THE INVENTION

A first aspect of the present invention is a method of forming a material comprising: providing a self-assembling block copolymer that includes a first block species and a second block species respectively characterized by a volume fraction of $F_1$ and $F_2$ with respect to said self-assembling block copolymer; providing at least one crosslinkable polymer that is miscible with said second block species; combining said self-assembling block copolymer with said at least one crosslinkable polymer to form a mixture, said crosslinkable polymer having a volume fraction $F_3$ in said mixture, said first and said second block species respectively having a volume fraction of $F_{1A}$ and $F_{2A}$ in said mixture; and processing said mixture to form a material, wherein a sum of $F_{2A}+F_{3A}$ and $F_3$ has been preselected prior to said combining such that said formed material has a predefined morphology.

A second aspect of the present invention is a method of forming a material comprising: providing at least one self-assembling block copolymer; providing at least one crosslinkable polymer, wherein said crosslinkable polymer is miscible with at least one block species of said self-assembling block copolymer; combining said at least one self-assembling block copolymer with said at least one crosslinkable polymer to form a mixture; applying said mixture onto a substrate forming a mixture coated substrate, comprising a layer of said mixture on said substrate; processing said mixture coated substrate to form a material in direct mechanical contact with said substrate, wherein said material is derived from the layer of said mixture and comprises a structural layer having nanostructures and an interfacial layer essentially lacking nanostructures.

A third aspect of the present invention is a structure comprising: a substrate; and a material adhered to said substrate, wherein said material comprises a structural layer having nanostructures and an interfacial layer essentially lacking nanostructures, said interfacial layer having a thickness in a range from about 0.5 nanometers (nm) to about 50 nm.

A fourth aspect of the present invention is a method of forming a material comprising: selecting a self-assembling block copolymer and a polymer miscible with at least one block species of said self-assembling block copolymer, wherein each said self-assembling block copolymer and said polymer have been selected to be crosslinkable; providing said self-assembling block copolymer; providing at least one said polymer; combining said one block copolymer with said at least one polymer to form a mixture; applying said mixture onto a substrate forming a mixture coated substrate; and processing said mixture coated substrate to form a material in direct mechanical contact with said substrate, wherein said material comprises a structural layer having nanostructures and an interfacial layer essentially lacking nanostructures.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
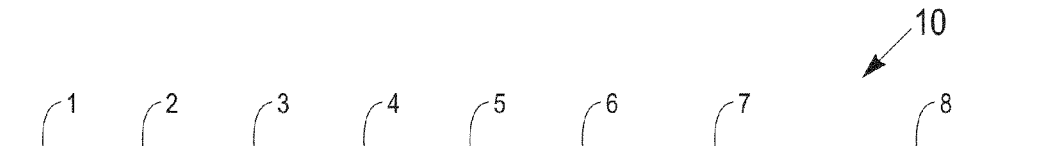
FIG. 1 depicts a table of experiments and theoretical predictions for forming materials having a predefined morphology, in accordance with the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. . . . , and are disclosed simply as an example of an embodiment. The features and advantages of the present invention are illustrated in detail in the accompanying drawing, wherein like reference numerals refer to like elements throughout the drawings. Although the drawings are intended to illustrate the present invention, the drawings are not necessarily drawn to scale.

The following are definitions:

A monomer as used herein is a molecule that can undergo polymerization thereby contributing constitutional units to the essential structure of a macromolecule, an oligomer, a block, a chain, and the like.

A polymer as used herein is a macromolecule of comprising multiple repeating smaller units or molecules (monomers) derived, actually or conceptually, from smaller units or molecules. The polymer may be natural or synthetic.

A copolymer as used herein is a polymer derived from more than one species of monomer.

A block copolymer as used herein is a copolymer that comprises more than one species of monomer, wherein the monomers are present in blocks. Each block of the monomer comprises repeating sequences of the monomer. A formula representative (1) of a block copolymer is shown below:

$$-(M_1)_a-(M_2)_b-(M_3)_c-(M_4)_d- \qquad (1)$$

wherein $M_1$, $M_2$, $M_3$, and $M_4$ represent monomer units and the subscripts "a", "b", "c", "d", represent the number of repeating units of $M_1$, $M_2$, $M_3$, and $M_4$ respectively. The above referenced representative formula is not meant to limit the structure of the block copolymer used in an embodiment of the present invention. The aforementioned monomers of the copolymer may be used individually and in combinations thereof in accordance with the method of the present invention.

A crosslinkable polymer as used herein is a polymer having a small region in the polymer from which at least 1-4 polymer chains may emanate, and may be formed by reactions involving sites or groups on existing polymers or may be formed by interactions between existing polymers. The small region may be an atom, a group of atoms, or a number of branch points connected by bonds, groups of atoms, or polymer chains. Typically, a crosslink is a covalent structure but the term is also used to describe sites of weaker chemical interactions, portions of crystallites, and even physical interactions such as phase separation and entanglements.

Morphology as used herein is to describe a form, a shape, a structure, and the like of a substance, a material, and the like as well as other physical and chemical properties (e.g. Young's Modulus, dielectric constant, etc. as described infra), Amphiphilic as used herein is used to describe a molecule and a macromolecule that is or has in part polar and non-polar portions that constitute the molecule and the macromolecule.

Thermosetting polymer as used herein is a polymer or a prepolymer in a soft solid or viscous state that changes irreversibly into an infusible, insoluble polymer network by curing. Typically, curing can be by the action of heat or radiation causing the production of heat, or both. Further, curing can be by the action of heat and/or radiation that produces heat resulting in the generation of a catalyst which serves to initiate crosslinking in the region of exposure.

Photosetting polymer as used herein is a polymer or a prepolymer in a soft solid or viscous state that changes irreversibly into an infusible, insoluble polymer network by curing. Typically, curing can be by the action of exposing the polymer or prepolymer to light. Further, curing can be by the action of exposure to radiation resulting in the generation of a catalyst which serves to initiate crosslinking in the region of exposure.

Nanostructure as used herein is a structure on the order of 1 nanometer (nm) to 500 nm in dimension. Examples of the structure may include but are not limited to nanorods, nanosheets, nanospheres, nanocylinders, nanocubes, nanoparticles, nanograins, nanofilaments, nanolamellae, and the like having solid composition and a minimal structural diameter in a range from about 1 nm to about 500 nm. Further examples of the structure may include but are not limited to spherical nanopores, cylindrical nanopores, nanotrenches, nanotunnels, nanovoids, and the like having their void or shape defined by the material or matrix that surrounds them and having a diameter in a range from about 1 nm to about 500 nm.

A substrate as used herein is a physical body (e.g. a layer or a laminate, a material, and the like) onto which a polymer or polymeric material may be deposited on or adhered to. A substrate may include materials of the Group I, II, III, and IV elements; plastic material; silicon dioxide, glass, fused silica, mica, ceramic, or metals deposited on the aforementioned substrates, and the like.

A method of forming a material comprises the steps of providing a self-assembling block copolymer that includes a first block species and a second block species respectively characterized by a volume fraction of $F_1$ and $F_2$ with respect to said self-assembling block copolymer; providing at least one crosslinkable polymer that is miscible with said second block species; combining said self-assembling block copolymer with said at least one crosslinkable polymer to form a mixture, said crosslinkable polymer having a volume fraction $F_3$ in said mixture, said first and said second block species respectively having a volume fraction of $F_{1A}$ and $F_{2A}$ in said mixture; and processing said mixture to form a material, wherein a sum of $F_{2A}$ and $F_3$ has been preselected prior to said combining such that said formed material has a predefined morphology in accordance with an embodiment of the present invention.

The self-assembling block copolymer provided in this example is polystyrene-block-poly(ethylene oxide), herein referred to as PS-b-PEO. The PS-b-PEO is comprised of two blocks of monomer species, polystyrene (PS) and polyethylene oxide (PEO). The composition of the PS-b-PEO can vary in the amount of PS block and PEO block present in the PS-b-PEO copolymer. The fractions of the monomer blocks present can be represented in percent millimoles (% mmol.), percent by weight (wt. %), volume fraction, and the like.

Typically the volume fraction of the PS block and the PEO block present in the PS-b-PEO is in a range from about 0.9 PS:0.1 PEO to about 0.1 PS:0.9 PEO. The crosslinkable polymer provided in this example is poly(methylsilsesquioxane), herein to referred as PMSSQ. The PMSSQ provided is miscible with the PEO block of PS-b-PEO in this example. The volume fraction of the PS block species and the PEO block species are herein to referred as $F_1$ and $F_2$ with respect to the PS-b-PEO self-assembling block copolymer.

The use of PS-b-PEO as the block copolymer is not meant to limit the type of the block copolymer that may be used in an embodiment of the present invention. Other block copolymers that may be used include but are not limited to amphiphilic organic block copolymers, amphiphilic inorganic block copolymers, organic di-block copolymers, organic mutli-block copolymers, inorganic di-block copolymers, inorganic mutli-block copolymers, linear block copolymers, star block copolymers, dendriditic block copolymers, hyperbranched block copolymers, graft block copolymers, and the like.

Specific examples of block copolymers that may be used in an embodiment of the present include but are not limited to PS-polyvinyl pyridine, PS-polybutadiene, PS-hydrogenated polybutadiene, PS-polyisoprene, PS-hydrogenated polyisoprene, PS-poly(methyl methacrylate), PS-polyalkenyl aromatics, polyisoprene-PEO, PS-poly(ethylene propylene), PEO-polycaprolactones, polybutadiene-PEO, polyisoprene-PEO, PS-poly(t-butyl methacrylate), poly(methyl methacrylate)-poly(t-butyl methacrylate), PEO-poly(propylene oxide), PS-poly(t-butylacrylate), and PS-poly(tetrahydrofuran). The aforementioned block copolymers may be used individually and in combinations thereof in accordance with the method of the present invention.

The use of PMSSQ as the crosslinkable polymer also is not meant to limit the type of the crosslinkable polymer that may be used in an embodiment of the present invention. Other crosslinkable polymers that may be used include but are not limited to silsesquioxanes having the formula structure $(RSiO_{1.5})_n$ where R=hydrido, alkyl, aryl, or alkyl-aryl, n is in a range from about 10-500, and the molecular weight is in a range from about 100-30,000; organic crosslinkable polymers; inorganic crosslinkable polymers; thermosetting crosslinkable polymers such as epoxy resins, phenolic resins, amino resins, bis-maleimide resins, dicyanate resins, allyl resins, unsaturated polyester resins, polyamides, and the like; photosetting crosslinkable polymers; polysilanes; polygermanes; carbosilanes; borazoles; carboranes; amorphous silicon carbides; carbon doped oxides; and the like. The aforementioned crosslinkable polymers may be used individually and in combinations thereof in accordance with the method of the present invention.

The PS-b-PEO self-assembling block copolymer is combined with the PMSSQ crosslinkable polymer to form a mixture. The PS-b-PEO is dissolved in toluene and the PMSSQ is dissolved in 1-propoxy-2-propanol. An aliquot of the first solution, PS-b-PEO in toluene, and an aliquot of the second solution, PMSSQ in 1-propoxy-2-propanol, then are combined to give the aforementioned mixture containing both the PS-b-PEO and PMSSQ.

Combining one self-assembling block copolymer with the crosslinkable polymer is not meant to limit the number of self-assembling block copolymers that may be combined in an embodiment of the present invention. Multiple self-assembling block copolymers may be combined with the crosslinkable individually and in combinations thereof in accordance with the method of the present invention.

The volume fraction of the crosslinkable polymer in the mixture, specifically, PMSSQ, is herein to referred as $F_3$. The volume fraction of the PS block species and the PEO block species in the mixture is herein to referred as $F_{1A}$ and $F_{2A}$ respectively. Preselecting the sum of the volume fraction $F_3$ and the volume fraction $F_{2A}$ prior to combining the PS-b-PEO with the PMSSQ to form the mixture allows one to determine the morphology of the material after processing the of the mixture as explained infra. Examples of the material morphology include but are not limited nanostructures such as spherical nanopores, cylindrical nanopores, nanolamellae, nanospheres, nanocylinders, and the like.

The mixture then is processed to form a material having a predefined morphology. A process that can be used is spin casting. A thin film of the mixture was deposited onto a substrate and spin cast. A typical spin speed was 3,000 rotations per minute (rpm) but may be in a range from about 50 rpm to about 5,000 rpm. The mixture was spin cast and annealed at a temperature of about 100° C. for about 10 hrs. Alternatively, the mixture may be processed by spin casting the solution and then annealing the adhering film under organic solvent vapor at room temperature (about 25° C.) from about 10 hrs to about 15 hrs.

After annealing, the mixture was further heated. The temperature was incrementally increased from about 100° C. to about 450° C. at a rate of about 5° C./min. under an inert gas atmosphere, typically nitrogen or argon. During the incremental heating, the PMSSQ crosslinks at a temperature in a range from about 150° C. to about 200° C. and the PS-b-PEO thermally decomposes at a temperature in range from about 350° C. to about 450° C. in an inert atmosphere. The result of the spin casting process is the material having a predefined morphology.

The spin casting process used is not meant to limit the type of processes that may be used in an embodiment of the present invention. Other processes such as chemical vapor deposition (CVD), photochemical irradiation, thermolysis, spraying, dip coating, doctor blading, and the like may be used individually and in combinations thereof in accordance with the method of the present invention.

FIG. 1 depicts a table 10 of experiments and theoretical predictions for forming materials having a predefined morphology, in accordance with the present invention. Column 1 is a listing of numerical entries for each experiment or theoretical prediction. Theoretical predictions are indicated with an entry having a superscript "th". Column 2 is a listing of the volume fraction $F_1$ of the PS block species of the PS-b-PEO self-assembling block copolymer. Column 3 is a listing of the volume fraction $F_2$ of the PEO block species of the PS-b-PEO self-assembling block copolymer. Column 4 is a listing of the volume fraction $F_{1A}$ of the PS block species in the mixture comprising PS-b-PEO and PMSSQ. Column 5 is a listing of the volume fraction $F_{2A}$ of the PEO block species in the mixture comprising PS-b-PEO and PMSSQ. Column 6 is a listing of the volume fraction $F_3$ of the PMSSQ in the mixture comprising PS-b-PEO and PMSSQ. Column 7 is a listing of the sum of the volume fraction $F_{2A}$ and the volume fraction $F_3$. Column 8 is a listing of the material morphology for each experiment or theoretical prediction.

Referring to FIG. 1, entries 19-25 and entries 30-34 are of experiments conducted that resulted in the formation of a material having a predefined morphology in accordance with the method of the present invention. The predefined morphologies experimentally demonstrated include spherical nanopores, cylindrical nanopores, and nanolamellae. A material having a morphology of spherical nanopores, column 8, may formed by preselecting a sum of a volume fraction $F_{2A}$ and $F_3$, column 7, that is within a range from about 0.82 to about 0.94, entries 30 and 34. Further, a material having a morphology of cylindrical nanopores may formed by preselecting a sum of a volume fraction $F_{2A}$ and $F_3$ that is within a range from about 0.7 to about 0.8, entries 21-23. Lastly, a material having a morphology of nanolamellae may formed by preselecting a sum of a volume fraction $F_{2A}$ and $F_3$ that is within a range from about 0.6 to about 0.65, entries 19 and 20.

Entries 19-25 and entries 30-34 experimentally demonstrate the ability to control a predefined morphology of a formed material by preselecting a sum of a volume fraction $F_{2A}$ and $F_3$, column 7, of a mixture PS-b-PEO and PMSSQ. The experimental data demonstrates the sum of a volume fraction $F_{2A}$ and $F_3$, column 7, may also be used as a theoretical predictor of a predefined morphology of a material formed in accordance with the methodology previously described.

Entries 1-18, 26-29, and 35-44 are theoretical predictions of a predefined morphology, column 8, of a material that would be expected based upon a sum of a volume fraction $F_{2A}$ and $F_3$, column 7. A material having a predefined morphology of spherical nanopores, entries 7, 8, 16, 17, and 35-44, would be expected if the sum of a volume fraction $F_{2A}$ and $F_3$ was in range from about 0.82 to about 0.94. Similarly, predefined morphologies of cylindrical nanopores, entries 6, 14, 15, and 27-29, and nanolamellae, entries 2-6, 8-13, and 18, would be expected if the sum of a volume fraction $F_{2A}$ and $F_3$ was in range from about 0.7 to about 0.8 and in a range from about 0.6 to about 0.65 respectively, Processing a mixture, wherein a sum of a volume fraction $F_{2A}$ and $F_3$ were preselected, results in the formation of a material having a predefined morphology and also results in the material comprising a structural layer having nanostructures and an interfacial layer essentially lacking nanostructures.

Figure 2:
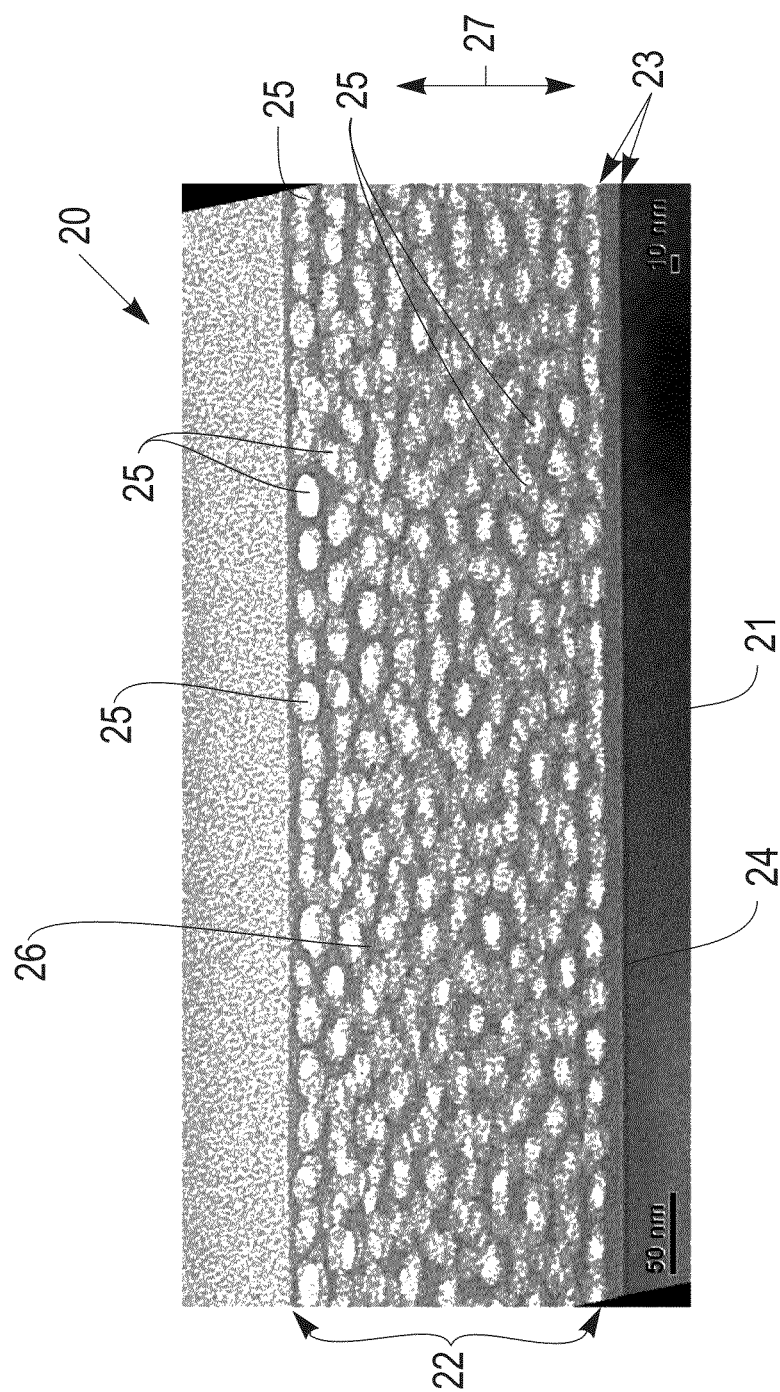
FIG. 2 depicts a cross-sectional Transmission Electron Microscopy (TEM) image of a material having a predefined morphology, in accordance with the present invention.

FIG. 2 depicts a cross-sectional Transmission Electron Microscopy (TEM) image of a material 20 having a predefined morphology, in accordance with the present invention. The material 20 comprises a structural layer 22 and an interfacial layer 23 in direct mechanical contact with the substrate 21. The interfacial layer 23 and the substrate 21 are in contact at an interface 24. The structural layer 22 comprises nanostructures 25 surrounded by a crosslinkable polymer 26. The interfacial layer 23 essentially lacks the nanostructures 25 and essentially comprises the crosslinkable polymer 26. The nanostructures 25 in the TEM image are spherical nanopores and will hereto be referred as such. An arrow 27 is normal, i.e. perpendicular, to the interface 24.

Figure 3:
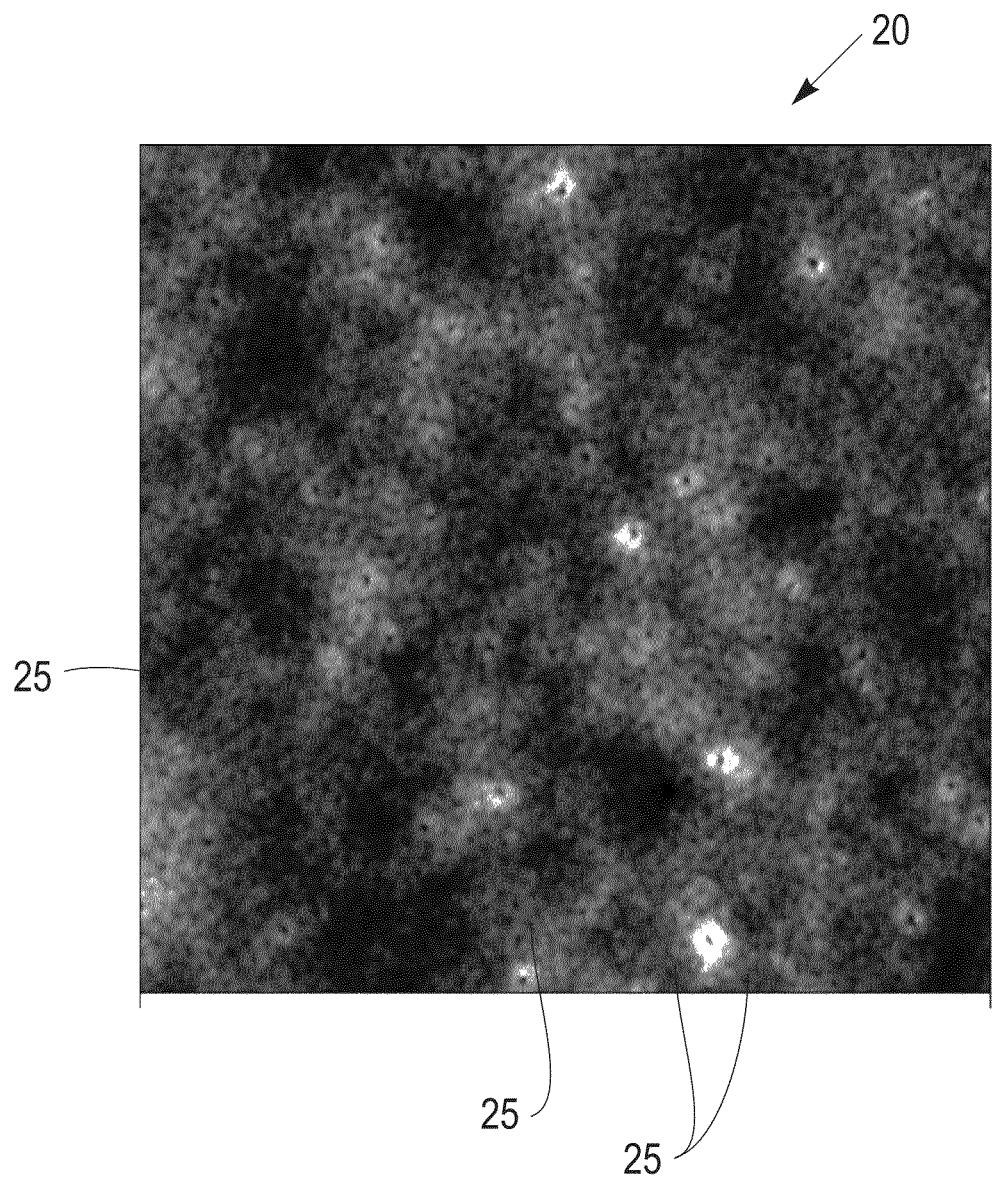
FIG. 3 depicts a surface Atomic Force Microscopy (AFM) image of the material having a predefined morphology, in accordance with the present invention.

FIG. 3 depicts a surface Atomic Force Microscopy (AFM) image of the material 20 having a predefined morphology being that of spherical nanopores 25, in accordance with the present invention. Referring to FIGS. 1-3, the material 20, was formed by processing a mixture having a preselected sum of a volume fraction $F_{2A}$ and a volume fraction $F_3$ being 0.91, as listed in entry 33 of the column 7. The interfacial layer 23 has a first thickness, wherein the first thickness is measured in a direction normal to the interface 24 as indicated by the arrow 27, in a range from about 2 nanometers (nm) to about 30 nm. The TEM image shows the interfacial layer 23 essentially lacks spherical nanopores 25 or any other nanostructures and is comprised essentially of the crosslinkable polymer 26, PMSSQ.

The structural layer 22 has a second thickness, wherein the second thickness is measured in a direction normal to the interface 24 as indicated by the arrow 27, in a range from about 50 nm to about 300 nm. The TEM image shows that the structural layer 22 having spherical nanopores 25 which are surrounded by the crosslinkable polymer 26, PMSSQ. The image further shows the diameter of the spherical nanopores 25 to be in a range from about 5 nm to about 100 nm.

The first thickness of the interfacial layer 23 is generally less than the second thickness of the structural layer 22 wherein said first and second thickness are each measured in a direction normal to the interface 24 as indicated by the arrow 27. A ratio of the first thickness to the second thickness is in a range from about 0.007 to about 0.6.

Figure 4:
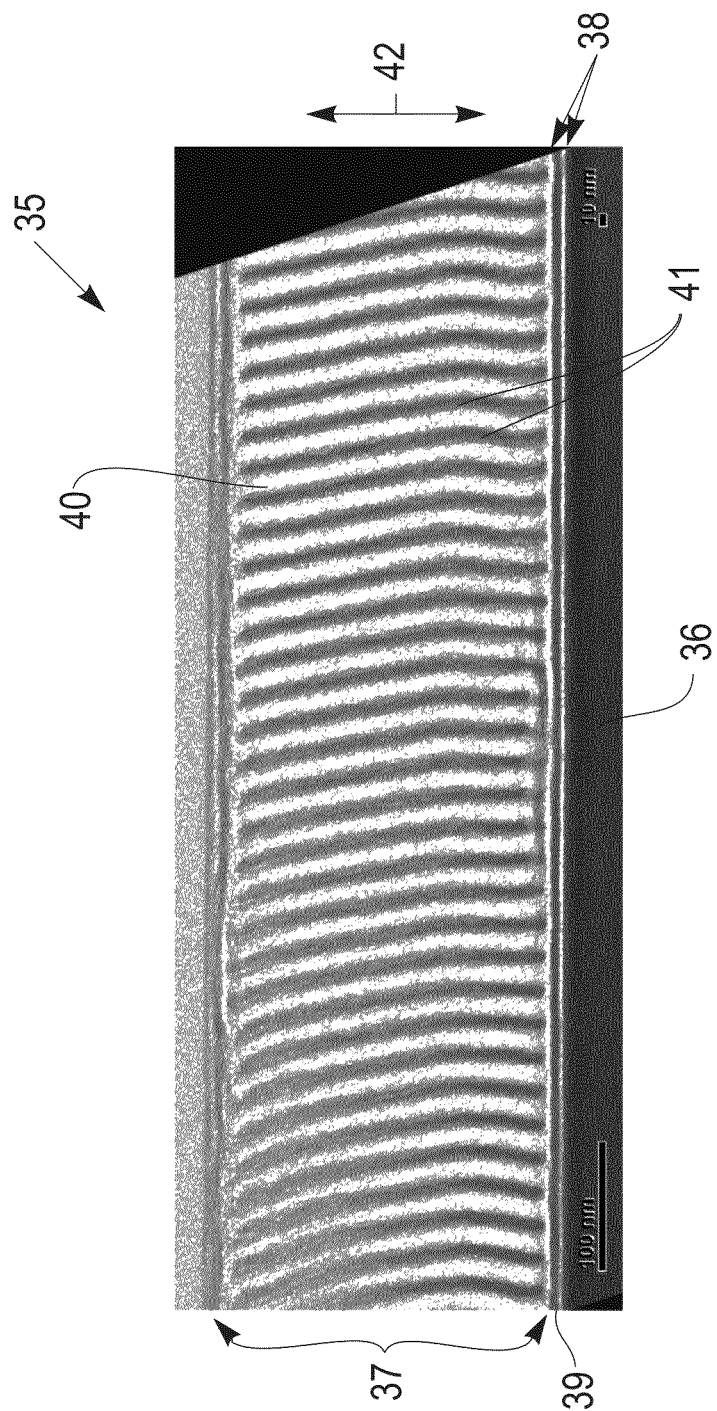
FIG. 4 depicts a second cross-sectional Transmission Electron Microscopy (TEM) image of a material having a predefined morphology, in accordance with the present invention.

FIG. 4 depicts a cross-sectional Transmission Electron Microscopy (TEM) image of a material 35 having a predefined morphology being that of cylindrical nanopores 40, in accordance with the present invention. The material 35 comprises a structural layer 37 and an interfacial layer 38 in direct mechanical contact with a substrate 36. The interfacial layer 38 and the substrate 36 are in contact at an interface 39. The structural layer 37 comprises nanostructures 40 surrounded by a crosslinkable polymer 41. The interfacial layer 38 essentially lacks the nanostructures 40 and essentially comprises the crosslinkable polymer 41. The nanostructures 40 in the TEM image are cylindrical nanopores and hereto will be referred as such. An arrow 42 is normal, i.e. perpendicular, to the interface 39.

Figure 5:
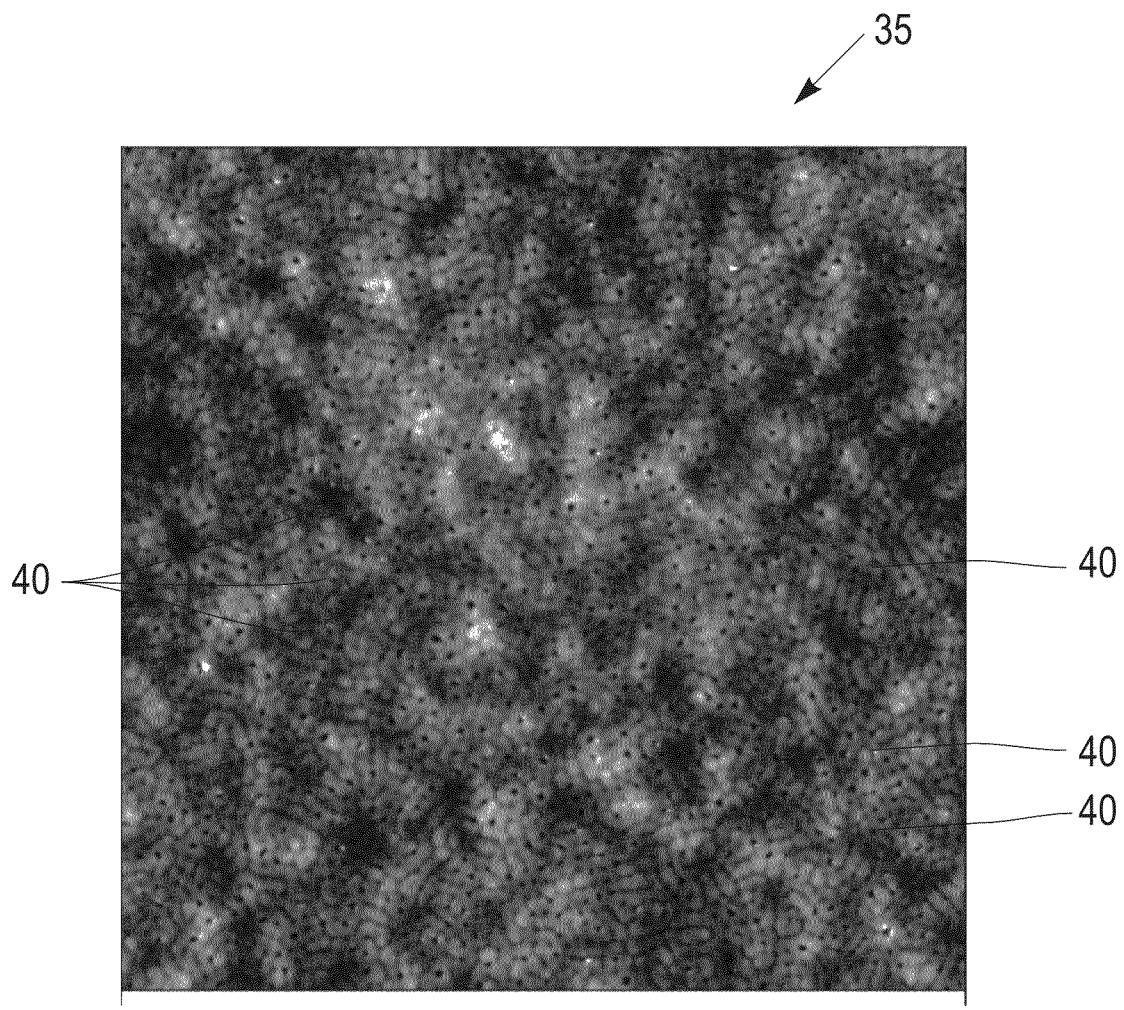
FIG. 5 depicts a second surface Atomic Force Microscopy (AFM) image of the material having a predefined morphology, in accordance with the present invention.

FIG. 5 depicts a surface Atomic Force Microscopy (AFM) image of the material 35 having a predefined morphology being that of cylindrical nanopores 40, in accordance with the present invention.

Referring to FIGS. 1, 4, and 5, the material 35 was formed by processing a mixture having a preselected sum of a volume fraction $F_{2A}$ and a volume fraction $F_3$ being 0.7, as listed in entry 21 of the column 7 of FIG. 1. The interfacial layer 38 and the structural layer 37 have a first and a second thickness in a range from about 2 nm to about 30 nm and a range from about 50 nm to about 300 nm, respectively. The first and second thickness each are measured in a direction normal to the interface 39 as indicated by the arrow 42.

The TEM image shows that the interfacial layer 38 essentially lacks cylindrical nanopores 40 or any other nanostructures and is comprised essentially of the crosslinkable polymer 41, PMSSQ. The TEM image also shows that the structural layer 37 has cylindrical nanopores 40 which are surrounded by the crosslinkable polymer 41, PMSSQ. The image further shows the diameter of the cylindrical nanopores 40 to be in a range from about 5 nm to about 100 nm.

The first thickness of the interfacial layer 38 is generally less than the second thickness of the structural layer 37 wherein said first and second thickness are each measured in a direction normal to the substrate 36 as indicated by the arrow 42. A ratio of the first thickness to the second thickness is in a range from about 0.007 to about 0.6.

Figure 6:
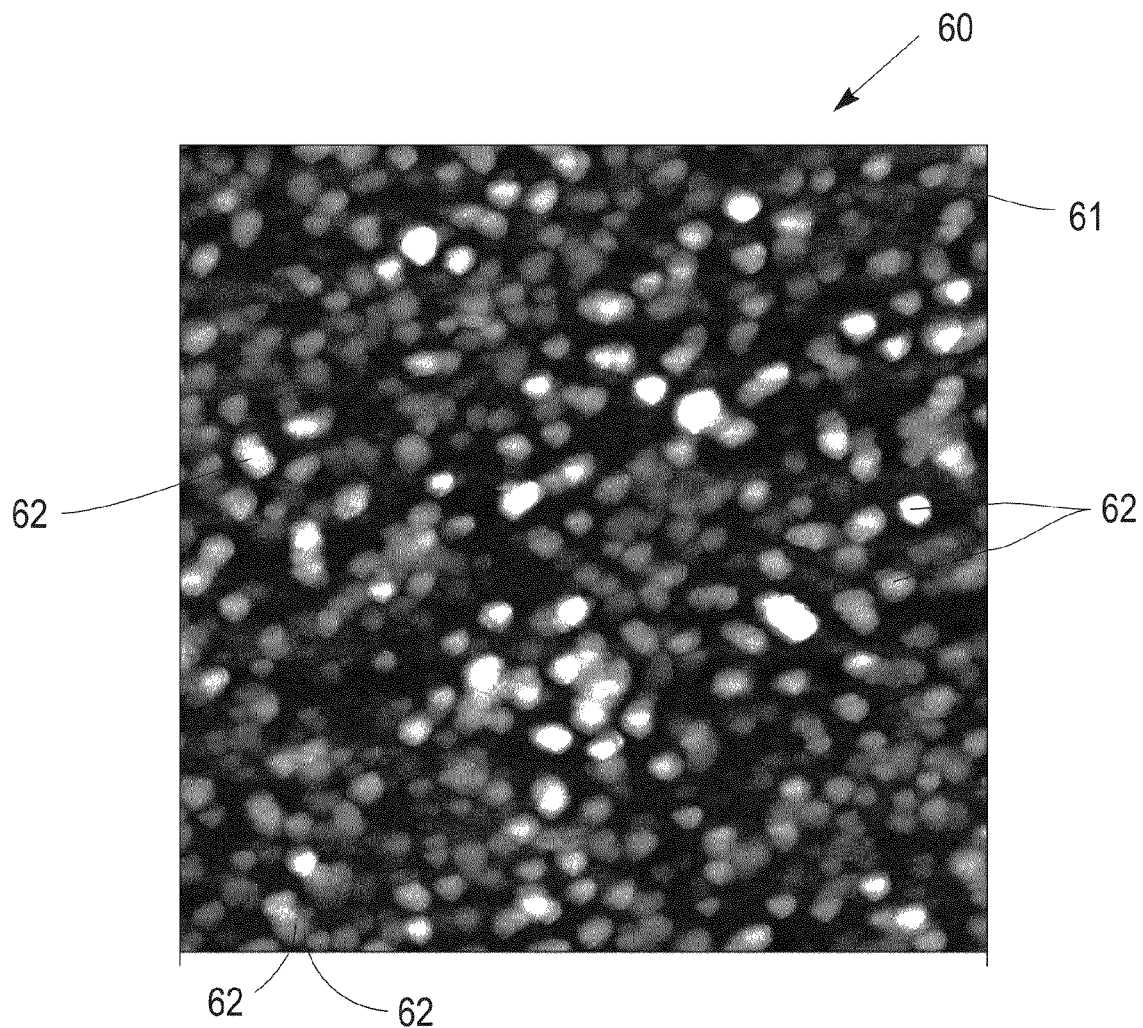
FIG. 6 depicts a third Atomic Force Microscopy (AFM) image of a material having a predefined morphology, in accordance with the present invention.
Figure 7:
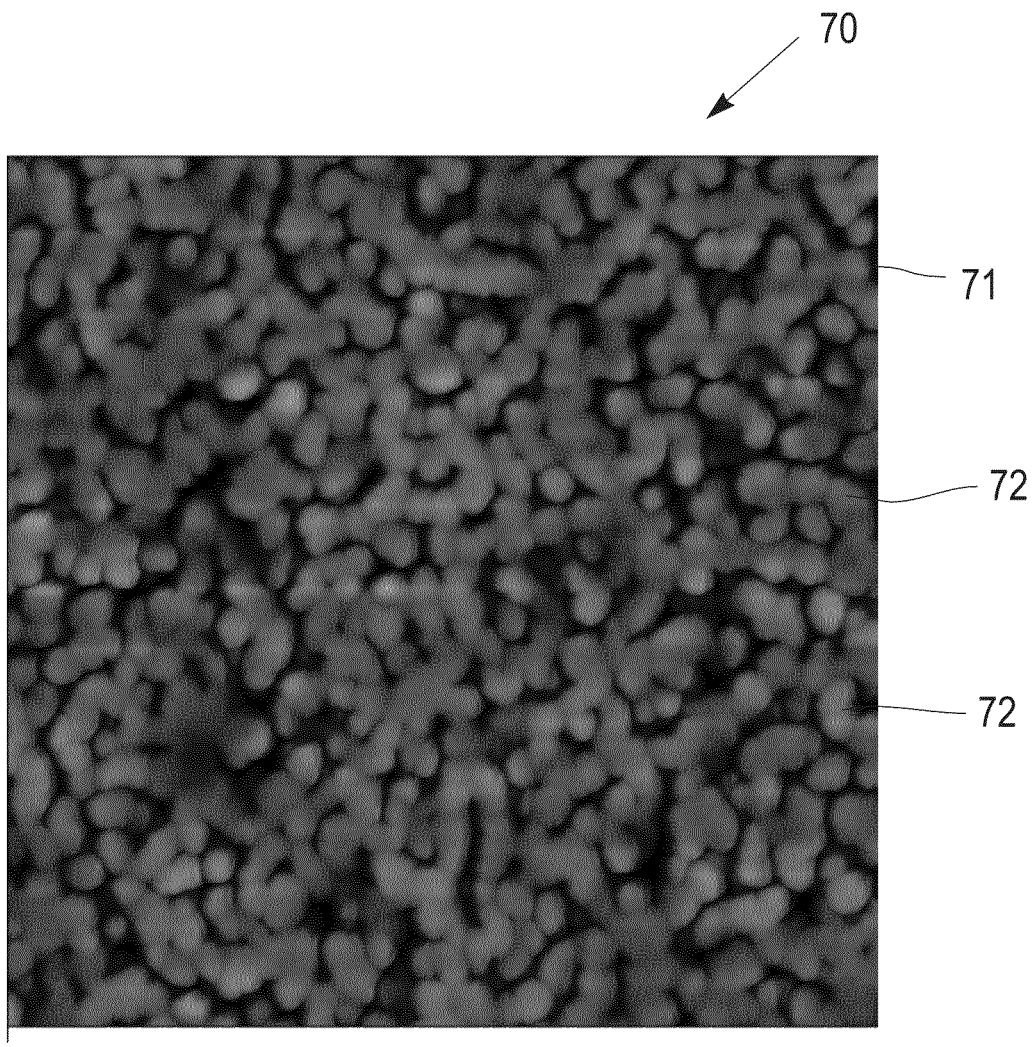
FIG. 7 depicts a fourth Atomic Force Microscopy (AFM) image of a material having a predefined morphology, in accordance with the present invention.

FIG. 6 depicts a surface Atomic Force Microscopy (AFM) image 60 of the material 61 having a predefined morphology being that of nanospheres 62, in accordance with the present invention. Referring to FIGS. 1 and 7, the material 61 was formed by processing a mixture having a preselected sum of a volume fraction $F_{2A}$ and a volume fraction $F_3$ being 0.19, as listed in entry 1 of the column 7 of FIG. 1. The nanospheres 62 are indicated in the AFM image 60.

FIG. 7 depicts a surface Atomic Force Microscopy (AFM) image 70 of the material 71 having a predefined morphology being that of nanolamellae 72, in accordance with the present invention. Referring to FIGS. 1 and 7, the material 71 was formed by processing a mixture having a preselected sum of a volume fraction $F_{2A}$ and a volume fraction $F_3$ being 0.6, as listed in entry 19 of the column 7 of FIG. 1. The nanolamellae 72 are indicated in the AFM image 70.

Figure 8:
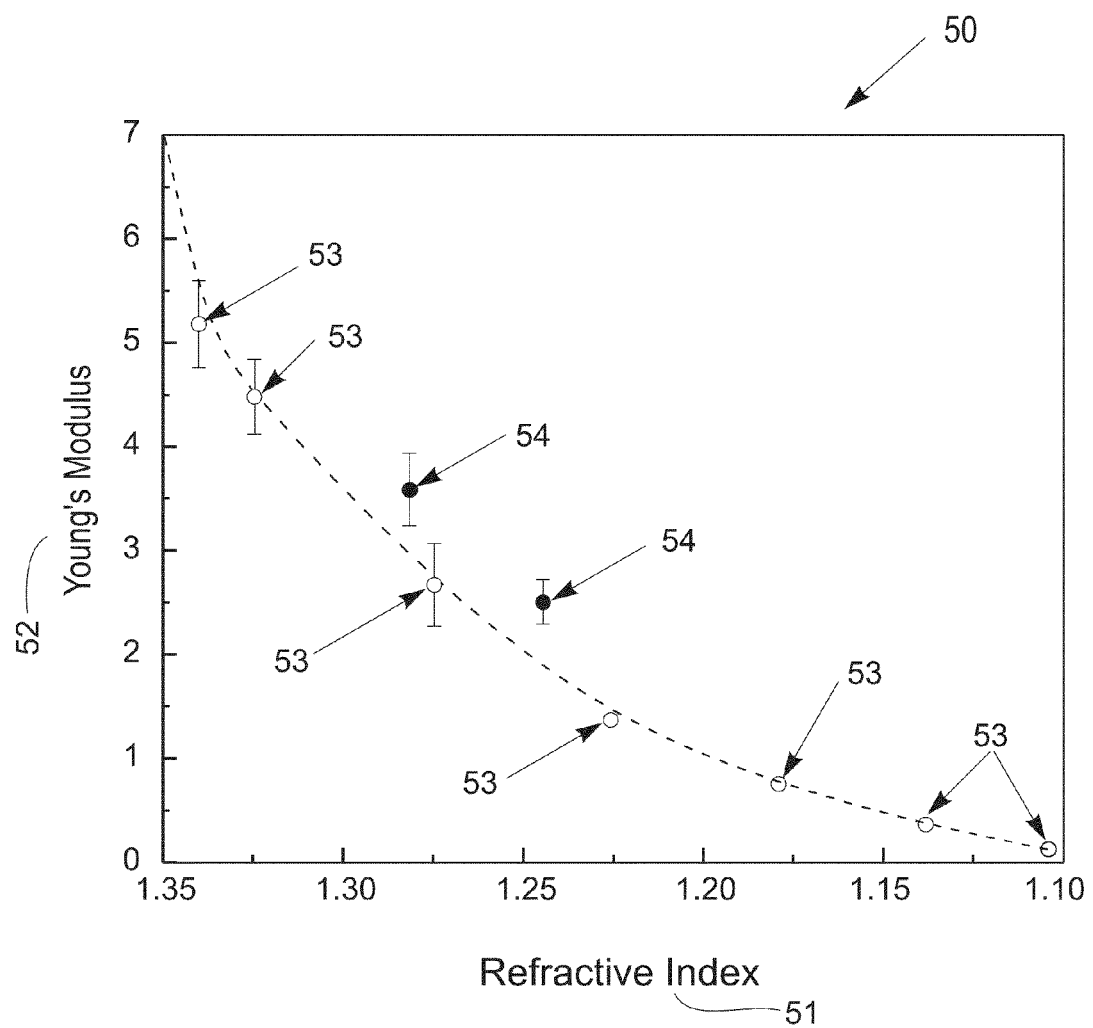
FIG. 8 depicts a plot of Young's modulus vs refractive index, in accordance with the present invention.

FIG. 8 depicts a plot 50 of Young's modulus vs refractive index, in accordance with the present invention. The x-axis 51 is refractive index and the y-axis 52 is Young's Modulus in units of GigaPascal. The Refractive index hereto will be referred as the porosity of a material as the refractive index is related to the amount of air incorporated, i.e. porosity, in the material. Data points 53 are for a material lacking nanostructures and data points 54 are for a material having nanostructures being spherical nanopores in this example.

Referring to FIGS. 2 and 6, a material formed by the methodology previously described not only has a predefined morphology but improved physical properties such as dielectric constant and Young's modulus. The dielectric constant of the material is in a range from about 1 to about 3 as determined by analytical techniques typically known to those skilled in the art. The Young's modulus of the materials is in a range from about 1 GigaPascal (GPa) to about 20 Gpa as determined by analytical techniques typically known to one skilled in the art.

From the plot 50, it can been seen that the material 20 having spherical nanopores 25 has higher porosity values, points 54, than a material lacking spherical nanopores 25 or any nanostructure, points 53. With the increase in porosity of the material 20 comes a subsequent increase in its Young's Modulus value in accordance with an embodiment of the present invention. The porosity of the material 20 is increased in the structural layer 22 having the spherical nanopores 25 but the porosity of the interfacial layer 23 is actually reduced. The TEM image shows the interfacial layer 23 essentially lacking any spherical nanopores 25 or any nanostructures.

The methods described to this point for the formation of materials having a predefined morphology can also be viewed as methods for reducing the porosity, i.e. preventing excess porosity, of the interfacial layer 23. The reduced porosity of the interfacial layer 23 of the material 20 is not meant to limit this property to materials having only the morphology of spherical nanopores. The materials previously described with varying predefined morphologies have the property of an interfacial layer with a reduced porosity.

The methods described to this point for the formation of materials having a predefined morphology include providing a self-assembling block copolymer and a crosslinkable polymer selectively miscible with a block species of the self-assembling block copolymer. Another embodiment of the present invention includes a providing self-assembling block polymer and a polymer miscible with at least one block species of the self-assembling copolymer, wherein either the self-assembling block copolymer and/or the polymer are selected to be crosslinkable with the other. Further combining and processing as previously described results in the formation of materials having the predefined morphologies as previously discussed, in accordance with the present invention.

The materials and methods described are not limited to use with only a substrate. The materials and methods of the present invention may be used in combination with nanoreactors, growth chambers, templates and templating devices, imaging masks, low-index photonics, bio-substrates, and separation media.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method of forming a material, said method comprising:
    combining a self-assembling block copolymer with at least one crosslinkable polymer to form a mixture, said self-assembling block copolymer including a first block species and a second block species respectively characterized by a volume fraction of $F_1$ and $F_2$ with respect to at least one self-assembling block copolymer, said at least one crosslinkable polymer being miscible with said second block species and having a volume fraction $F_3$ in said mixture, said first and said second block species respectively having a volume fraction of $F_{1A}$ and $F_{2A}$ in said mixture;
    processing said mixture to form a material; and
    prior to said combining:
        providing a tangible data table comprising data in which each morphology of a plurality of morphologies and a range of $(F_{2A}+F_3)$ of a plurality of ranges of $(F_{2A}+F_3)$ are associated with each other, wherein $(F_{2A}+F_3)$ denotes a sum of $F_{2A}$ and $F_3$, wherein said data has a characteristic that a performance of said combining and said processing using a value of $(F_{2A}+F_3)$ in any range of $(F_{2A}+F_3)$ of the plurality of ranges of $(F_{2A}+F_3)$ in the data table forms a material having the morphology associated with said any range of $(F_{2A}+F_3)$ in the data table;
        selecting a morphology from the plurality of morphologies;
        selecting from the data table the range of $(F_{2A}+F_3)$ associated with the selected morphology; and
        preselecting $(F_{2A}+F_3)$ from the selected range of $(F_{2A}+F_3)$.

2. The method of claim 1, wherein the plurality of morphologies in the data table comprises a morphology of spherical nanopores, a morphology of cylindrical nanopores, and a morphology of nanolamellae.

3. A method of forming a material, said method comprising:
    combining a self-assembling block copolymer with at least one crosslinkable polymer to form a mixture, said self-assembling block copolymer including a first block species and a second block species respectively characterized by a volume fraction of $F_1$ and $F_2$ with respect to at least one self-assembling block copolymer, said at least one crosslinkable polymer being miscible with said second block species and having a volume fraction $F_3$ in said mixture, said first and said second block species respectively having a volume fraction of $F_{1A}$ and $F_{2A}$ in said mixture;
    processing said mixture to form a material; and
    prior to said combining:
        providing a tangible data table comprising data in which each morphology of a plurality of morphologies and a range of $(F_{2A}+F_3)$ of a plurality of ranges of $(F_{2A}+F_3)$ are associated with each other, wherein $(F_{2A}+F_3)$ denotes a sum of $F_{2A}$ and $F_3$, wherein said data has a characteristic that a performance of said combining and said processing using a value of $(F_{2A}+F_3)$ in any range of $(F_{2A}+F_3)$ of the plurality of ranges of $(F_{2A}+F_3)$ in the data table forms a material having the morphology associated with said any range of $(F_{2A}+F_3)$ in the data table;
        selecting a morphology from the plurality of morphologies;
        selecting from the data table the range of $(F_{2A}+F_3)$ associated with the selected morphology; and
        preselecting $(F_{2A}+F_3)$ from the selected range of $(F_{2A}+F_3)$, wherein the plurality of morphologies in the data table comprises a morphology of spherical nanopores, a morphology of cylindrical nanopores, and a morphology of nanolamellae, wherein the range of $(F_{2A}+F_3)$ associated with the morphology of spherical nanopores is from about 0.82 to about 0.94, wherein the range of $(F_{2A}+F_3)$ associated with the morphology of cylindrical nanopores is from about 0.70 to about 0.80, and wherein the range of $(F_{2A}+F_3)$ associated with the morphology of nanolamellae is from about 0.60 to about 0.65.

4. The method of claim 3, wherein said selecting the morphology consists of selecting the morphology of spherical nanopores.

5. The method of claim 3, wherein said selecting the morphology consists of selecting the morphology of cylindrical nanopores.

6. The method of claim 3, wherein said selecting the morphology consists of selecting the morphology of nanolamellae.

7. The method of claim 1, wherein said self-assembling block copolymer includes polymers selected from the group consisting of amphiphilic organic block copolymers, amphiphilic inorganic block copolymers, organic di-block copolymers, organic mutli-block copolymers, inorganic di-block copolymers, inorganic mutli-block copolymers, linear block copolymers, star block copolymers, dendritic block copolymers, hyperbranched block copolymers, graft block copolymers, and combinations thereof.

8. The method of claim 1, wherein said self-assembling block copolymer includes polymers selected from the group consisting of polystyrene (PS)-polyvinyl pyridine, PS-polybutadiene, PS-polyisoprene, PS-hydrogenated polyisoprene, PS-poly(methyl methacrylate), PS-poly(alkenyl aromatics), PS-poly(ethylene oxide) (PEO), PS-poly(ethylene propylene), PEO-polycaprolactones, polybutadiene-PEO, polyisoprene-PEO, PS-poly(t-butyl methacrylate), poly(methyl methacrylate)-poly(t-butyl methacrylate), PEO-poly(propylene oxide), PS-poly(t-butylacrylate), and PS-poly(tetrahydrofuran), and combinations thereof.

9. The method of claim 1, wherein said at least one crosslinkable polymer includes polymers selected from the group consisting of organic crosslinkable polymers, inorganic cross-linkable polymers, thermosetting crosslinkable polymers, photosetting crosslinkable polymers, radiation crosslinkable polymers, and combinations thereof.

10. The method of claim 1, wherein said at least one crosslinkable polymer includes polymers selected from the group consisting of polysilanes, polygermanes, carbosilanes, borazoles, carboranes, amorphous silicon carbide, carbon doped oxides, and silsesquioxanes $(RSiO_{1.5})_n$, wherein R is selected from the group consisting of a hydrido group, an alkyl group, an aryl group, and an alkyl-aryl group, and n is in a range from about 10 to about 500.

11. The method of claim 1, wherein said selected morphology includes nanopores selected from the group consisting of spherical nanopores, cylindrical nanopores, and combinations thereof, and wherein the nanopores have a diameter in a range from 5 nanometers (nm) to about 100 nm.

12. The method of claim 1, wherein said processing comprises:
applying the mixture onto a substrate forming a mixture coated substrate comprising a layer of the mixture on the substrate; and
processing the mixture coated substrate to form said material in direct mechanical contact with the substrate, wherein the material is derived from the layer of the mixture and comprises a structural layer and an interfacial layer, wherein the structural layer comprises nanostructures having the selected morphology and being surrounded by the at least one crosslinkable polymer, wherein the interfacial layer lacks nanostructures and consists essentially of the at least one crosslinkable polymer.

13. The method of claim 12, wherein the interfacial layer has a first thickness less than a second thickness of the structural layer, wherein the first thickness and the second thickness are each measured in a direction normal to an interface between the interfacial layer and the substrate, wherein a ratio of the first thickness to the second thickness is in a range from about 0.007 to about 0.6, wherein the first thickness is in a range from about 2 nm to about 30 nm, wherein the second thickness is in a range from about 50 nm to about 300 nm.

14. The method of claim 1, wherein the data table has a column of values of $(F_{2,4}+F_3)$ and a column of morphology identifiers.

15. The method of claim 3, wherein the data table has a column of values of $(F_{2,4}+F_3)$ and a column of morphology identifiers.

* * * * *